US008983386B2

(12) United States Patent
Rofougaran et al.

(10) Patent No.: US 8,983,386 B2
(45) Date of Patent: *Mar. 17, 2015

(54) REMOTE POWER DISTRIBUTION

(71) Applicant: Broadcom Corporation, Irvine, CA (US)

(72) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/080,678

(22) Filed: Nov. 14, 2013

(65) Prior Publication Data

US 2014/0080425 A1    Mar. 20, 2014

Related U.S. Application Data

(63) Continuation of application No. 12/797,112, filed on Jun. 9, 2010, now Pat. No. 8,588,686.

(60) Provisional application No. 61/246,618, filed on Sep. 29, 2009, provisional application No. 61/185,245, filed on Jun. 9, 2009.

(51) Int. Cl.
| | |
|---|---|
| *H04B 7/00* | (2006.01) |
| *G01S 13/06* | (2006.01) |
| *H01Q 1/22* | (2006.01) |
| *H01Q 13/22* | (2006.01) |
| *H01Q 13/20* | (2006.01) |
| *H04B 1/04* | (2006.01) |
| *H04B 5/00* | (2006.01) |
| *H04B 7/24* | (2006.01) |
| *H01Q 15/00* | (2006.01) |

(52) U.S. Cl.
CPC ............. *G01S 13/06* (2013.01); *H01Q 1/2283* (2013.01); *H01Q 13/22* (2013.01); *H01Q 13/20* (2013.01); *H04B 1/04* (2013.01); *H04B 1/0458* (2013.01); *H04B 5/0031* (2013.01); *H04B 7/24* (2013.01); *H01Q 15/006* (2013.01)
USPC .......... 455/41.2; 455/414.1; 455/41.3; 455/39

(58) Field of Classification Search
CPC .................................................. H04W 84/18
USPC ............................... 455/414.1, 41.3, 39, 41.2
See application file for complete search history.

(56) References Cited

U.S. PATENT DOCUMENTS

| | | | |
|---|---|---|---|
| 6,735,630 B1 * | 5/2004 | Gelvin et al. | ................. 709/224 |
| 7,020,701 B1 * | 3/2006 | Gelvin et al. | ................. 709/224 |

(Continued)

*Primary Examiner* — April G Gonzales
(74) *Attorney, Agent, or Firm* — Oblon, McClelland, Maier & Neustadt, L.L.P.

(57) ABSTRACT

A Method and system for remote power distribution and networking for passive devices is provided. In this regard, a sensor comprising a leaky wave antenna may be powered utilizing energy from a radio frequency signal received via the leaky wave antenna. The sensor may be operable to recover a baseband signal from the received radio frequency signal. The sensor may be operable to generate one or more sensor readings in response to the received baseband signal. The sensor may be operable to communicate the sensor reading to a source of the received radio frequency signal via a backscattered signal. The backscattered signal may be generated by controlling spacing between surfaces of the leaky wave antenna. The backscattered signal may be generated by switching a load in and out of a receive path of the sensor and/or by switching between a plurality of feed points of the leaky wave antenna.

18 Claims, 13 Drawing Sheets

(56) References Cited

U.S. PATENT DOCUMENTS

| | | | |
|---|---|---|---|
| 2004/0203944 A1* | 10/2004 | Huomo et al. | 455/466 |
| 2005/0012667 A1* | 1/2005 | Noujeim | 343/700 MS |
| 2005/0136972 A1* | 6/2005 | Smith et al. | 455/554.1 |
| 2006/0109127 A1* | 5/2006 | Barink et al. | 340/572.2 |
| 2007/0171076 A1* | 7/2007 | Stevens et al. | 340/572.8 |
| 2008/0068174 A1* | 3/2008 | Al-Mahdawi | 340/572.7 |
| 2010/0311333 A1* | 12/2010 | Rofougaran et al. | 455/41.2 |

* cited by examiner

REMOTE POWER DISTRIBUTION

This is a continuation of application Ser. No. 12/797,112 filed Jun. 9, 2010.

CLAIM OF PRIORITY

This application makes reference to, claims the benefit from, and claims priority to U.S. Provisional Application Ser. No. 61/246,618 filed on Sep. 29, 2009, and U.S. Provisional Application Ser. No. 61/185,245 filed on Jun. 9, 2009.

Each of the above stated applications is hereby incorporated herein by reference in its entirety.

INCORPORATION BY REFERENCE

This application also makes reference to:
U.S. patent application Ser. No. 12/650,212 filed on Dec. 30, 2009;
U.S. patent application Ser. No. 12/650,295 filed on Dec. 30, 2009;
U.S. patent application Ser. No. 12/650,277 filed on Dec. 30, 2009;
U.S. patent application Ser. No. 12/650,192 filed on Dec. 30, 2009;
U.S. patent application Ser. No. 12/650,224 filed on Dec. 30, 2009;
U.S. patent application Ser. No. 12/650,176 filed on Dec. 30, 2009;
U.S. patent application Ser. No. 12/650,246 filed on Dec. 30, 2009;
U.S. patent application Ser. No. 12/650,292 filed on Dec. 30, 2009;
U.S. patent application Ser. No. 12/650,324 filed on Dec. 30, 2009;
U.S. patent application Ser. No. 12/708,366 filed on Feb. 18, 2010;
U.S. patent application Ser. No. 12/751,550 filed on Mar. 31, 2010;
U.S. patent application Ser. No. 12/751,768 filed on Mar. 31, 2010;
U.S. patent application Ser. No. 12/751,759 filed on Mar. 31, 2010;
U.S. patent application Ser. No. 12/751,593 filed on Mar. 31, 2010;
U.S. patent application Ser. No. 12/751,772 filed on Mar. 31, 2010;
U.S. patent application Ser. No. 12/751,777 filed on Mar. 31, 2010;
U.S. patent application Ser. No. 12/751,782 filed on Mar. 31, 2010;
U.S. patent application Ser. No. 12/751,792 filed on Mar. 31, 2010;
U.S. patent application Ser. No. 12/751,751 filed on Mar. 31, 2010;
U.S. patent application Ser. No. 12/790,279 filed on May 28, 2010;
U.S. patent application Ser. No. 12/797,029 filed on even date herewith;
U.S. patent application Ser. No. 12/797,068 filed on even date herewith;
U.S. patent application Ser. No. 12/797,162 filed on even date herewith;
U.S. patent application Ser. No. 12/797,177 filed on even date herewith;
U.S. patent application Ser. No. 12/797,203 filed on even date herewith;
U.S. patent application Ser. No. 12/797,822 filed on even date herewith;
U.S. patent application Ser. No. 12/797,214 filed on even date herewith;
U.S. patent application Ser. No. 12/796,841 filed on even date herewith;
U.S. patent application Ser. No. 12/797,232 filed on even date herewith;
U.S. patent application Ser. No. 12/796,862 filed on even date herewith;
U.S. patent application Ser. No. 12/796,975 filed on even date herewith;
U.S. patent application Ser. No. 12/797,254 filed on even date herewith;
U.S. patent application Ser. No. 12/797,273 filed on even date herewith; and
U.S. patent application Ser. No. 12/797,316 filed on even date herewith.

Each of the above stated applications is hereby incorporated herein by reference in its entirety.

FIELD OF THE INVENTION

Certain embodiments of the invention relate to wireless communication. More specifically, certain embodiments of the invention relate to a method and system for remote power distribution and networking for passive devices.

BACKGROUND OF THE INVENTION

As the number of electronic devices enabled for wired and/or mobile communications continues to increase, significant efforts exist with regard to making such devices more power efficient. In this regard, battery life has become one of the most important considerations when purchasing electronic devices. Furthermore, for communication devices, transmit and/or receive circuitry often accounts for a significant portion of the power consumed within these devices. As a result, portable wireless devices become much less portable due to the fact that they have to spend so much time tethered to a charging port. Similarly, stationary wireless devices become much more limited in where we can install them because they need to be located near a power source or a power source needs to be brought to them.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for a remote power distribution and networking for passive devices as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for remote power distribution and networking for passive devices. In various embodiments of the invention, a sensor may be powered utilizing energy from a radio frequency signal received via a leaky wave antenna. The sensor may be operable to recover a baseband signal from the received radio frequency signal and generate one or more sensor readings in response to the received baseband signal. The sensor may be operable to communicate the sensor reading to a source of the received radio frequency signal via a backscattered signal. The backscattered signal may be generated by controlling spacing between surfaces of the leaky wave antenna. The spacing between surfaces of the leaky wave antenna may be controlled via a micro-electromechanical system (MEMS) switch. The backscattered signal may be generated by switching a load in and out of a receive path of the sensor. The backscattered signal may be generated by switching between a plurality of feed points of the leaky wave antenna. The radio frequency signal may be at or near 60 GHz. The sensor and the leaky wave antenna may be integrated within and/or on an integrated circuit. The leaky wave antenna may be integrated within and/or on an integrated circuit package. The backscattered signal may be generated by controlling an input impedance of the sensor. The backscattered signal may be modulated at 900 MHz or 2.4 GHz.

Figure 1:
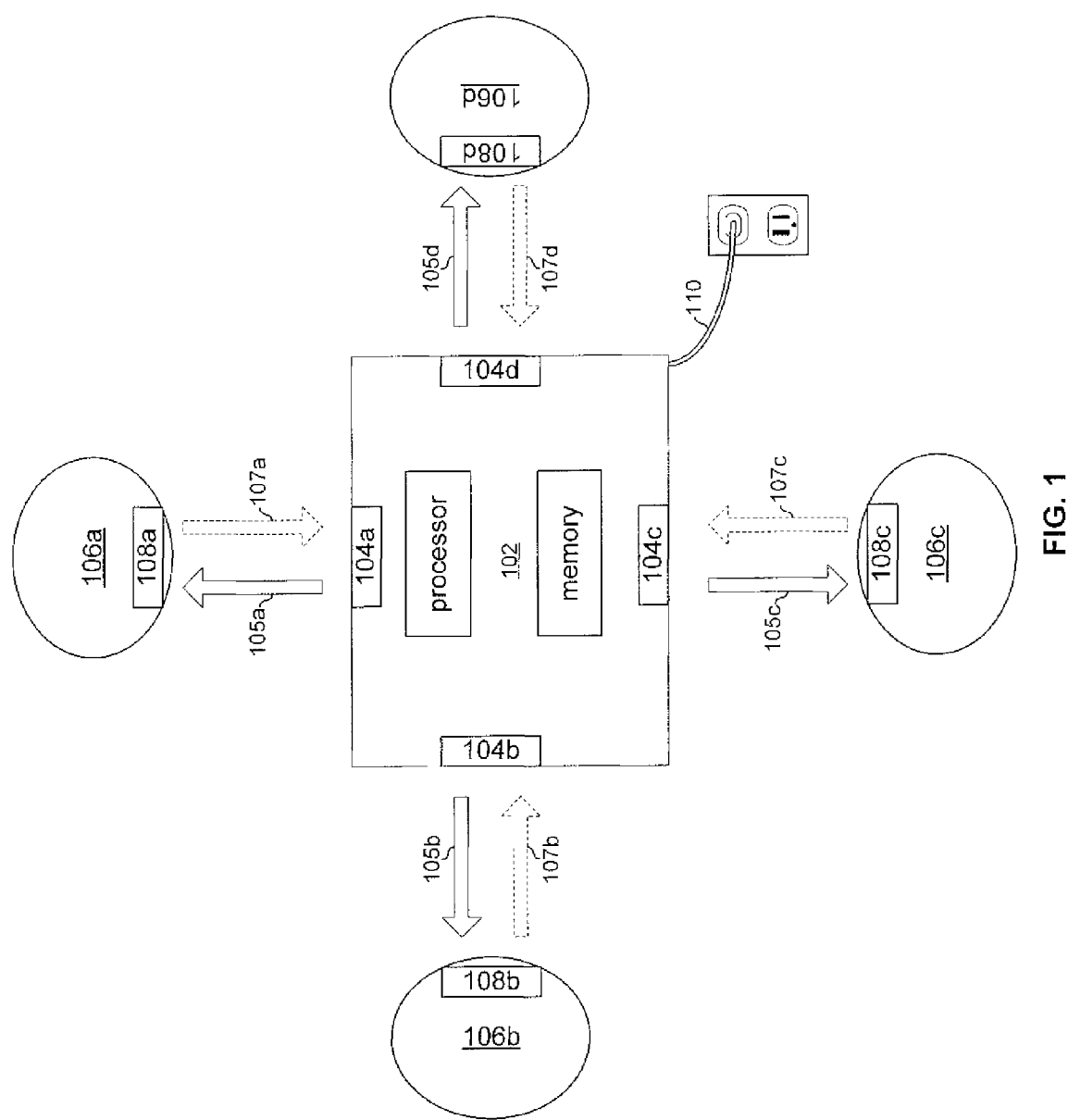
FIG. 1 is a diagram illustrating a network of devices comprising a central device and one or more satellite devices wirelessly powered by the hub device, in accordance with an embodiment of the invention.

FIG. 1 is a diagram illustrating a network of devices comprising a central device and one or more satellite devices wirelessly powered by the hub device, in accordance with an embodiment of the invention. Referring to FIG. 1 there is shown a central device 102 comprising leaky wave antennas 104a-104d and satellite devices 106a-106d comprising leaky wave antennas 108a-108d, respectively.

The central device 102 may comprise suitable logic, circuitry, interfaces, and/or code that may be operable to implement various aspects of the invention. For example, the central device 102 may comprise one or more processors and one or more memory devices which may store instructions executed by the processor and/or data processed by the processor. The central device 102 may be operable to transmit signals 105a-105d via the leaky wave antennas 104a-104d, respectively. The signals 105a-105d may be of sufficient energy, and the leaky wave antennas 104a-104d and 108a-108d may provide sufficient gain, such that the satellite devices 106a-106d may be powered by the signals 105a-105d, respectively. The central device 102 may also be operable to receive the backscattered signals 107a-107d via the antennas 104a-104d, respectively. In an exemplary embodiment of the invention the signals 105a-105d may extremely high frequency. For example, signals 105a-105d may at or near 60 GHz. The central device may be powered via the cable 110.

Each of the satellites devices 106a-106d may comprise suitable logic, circuitry, interfaces, and/or code that may be operable to implement various aspects of the invention. The satellites devices 106a-106d may be operable to receive the signals 105a-105d via the leaky wave antennas 108a-108d, respectively. The satellite devices 106a-106d may be operable to demodulate, decode, and/or otherwise process the signals 105a-105d, respectively, to recover information from the signals. In an exemplary embodiment of the invention, a frequency of the signals 105a-105d may be at or near 60 GHz. Also, the satellite devices 106a-106d may be powered by energy harvested from the signals 105a-105d. In this manner, the satellite devices 106a-106d may be placed in locations where power is unavailable and/or where it would be difficult and/or inconvenient to have to periodically change the batteries. For example, the devices may be underwater and/or implanted in a person or animal. Additional details of an exemplary device 106 are described below with respect to FIGS. 8A-8D. Each of the satellite devices 106a-106d may also be operable to modulate its input impedance to communicate with the central device 102 via the backscattered signals 107a-107d, respectively. Since the signals 107a-107d are backscattered signals, they may be at or near the frequency of the signals 105a-105d. Additionally, the backscattered signals 107a-1078d may be modulated at 900 MHz and/or 2.4 GHz. Also, each of the satellites devices 106a-106d may be operable to implement any one or more of a variety of functions. For example, each of the satellite devices 106a-106d may comprise a sensor, a camera, and/or a computer peripheral.

In various embodiments of the invention, the satellite devices 106a-106d may be implemented on one or more integrated circuits. For example, each of the satellite devices 106a-106d may comprise a packaged integrated circuit with the leaky wave antennas 108a-108d integrated on and/or within the integrated circuit and/or the integrated circuit package.

Each of the leaky wave antennas 104a-104d and 108a-108d may comprise a resonant cavity with a highly reflective surface and a lower reflectivity surface. The lower reflectivity surface may allow the resonant mode to "leak" out of the cavity. The lower reflectivity surface of each of the leaky wave antennas 104a-104d and 108a-108d may comprise a slotted metal surface or a pattern of metal patches, as described further in FIGS. 2 and 3. The bandwidth and/or radiation pattern of each of the leaky wave antennas 104a-104d and 108a-108d may be determined, at least in part, by the physical dimensions of each of the leaky wave antennas 104a-104d and 108a-108d. In an exemplary embodiment of the invention, each of the leaky wave antennas 104a-104d and 108a-108d may be operable to transmit and/or receive wireless signals at or near 60 GHz, for example, due to the cavity height being on the order of millimeters. In an exemplary embodiment of the invention, the cavity height of each of the leaky wave antennas 104a-104d and 108a-108d may be configured, e.g., via MEMS, to control the frequency of the signals that may be transmitted and/or received.

In operation, the central device 102 may decide to power up the satellite devices 106a-106d. In this regard, the decision to power up the satellite device 106a-106d may be based on a request from a user interacting with the central device 102 and/or based operation of the central device 102. In an exemplary embodiment of the invention, the satellite devices 106a-106d may comprise sensors and the central device 102 may require readings from the sensors. In another exemplary embodiment of the invention, the central device 102 may comprise a computer and the satellite devices 106a-106d may comprise peripheral devices via which the central device 102 desires to receive input and/or provide output.

Upon determining to power up the satellite devices 106a-106d, the central device 102 may begin transmitting the signals 105a-105d. The satellite devices 106a-106d may harvest the energy from the signals 105a-105d, as described below with respect to FIGS. 8A-8D, and power up once a sufficient voltage has been built up. Upon powering up, the satellite devices 106a-106d may send signals 107a-107b to the central device 102 to indicate that they are operational. The central device 102 may then send one or more commands to the satellite devices 106a-106d for the devices to perform a function. For example, in instances that the satellite devices are sensors, the command may cause the satellite devices 106a-106d to take a reading and communicate the reading to the central device 102 via the signals 107a-107d. As another example, the command may cause the satellite devices 106a-106d to begin generating data and communicate that data to the central device 102 via the signals 107a-107d. As another example, the satellite devices 106a-106d may comprise solid state memory and the command may cause the satellite devices 106a-106d to begin accepting and storing the data.

Figure 2:
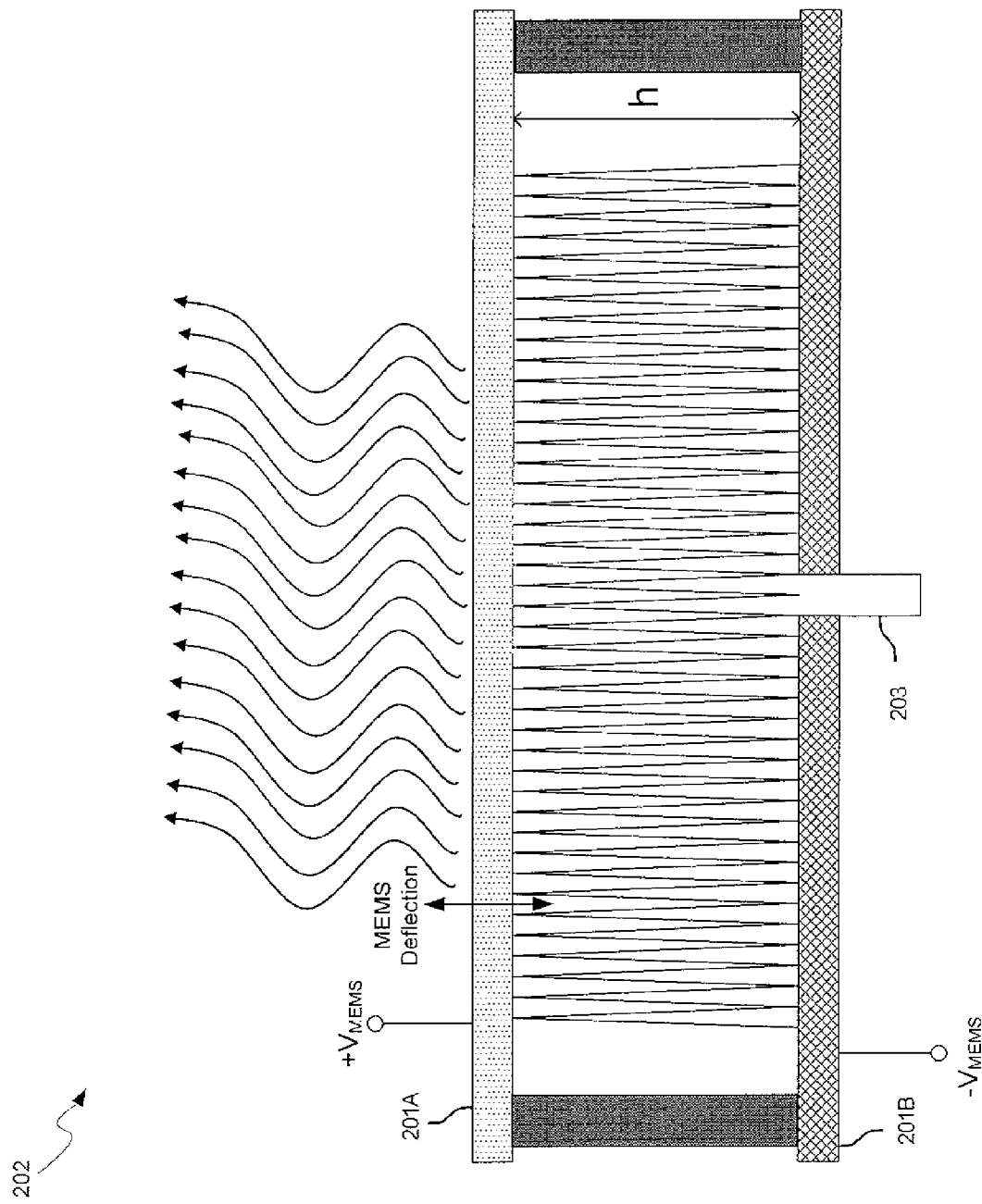
FIG. 2 is a cross-sectional view of an exemplary leaky wave antenna, in accordance with an embodiment of the invention.

FIG. 2 is a cross-sectional view of an exemplary leaky wave antenna, in accordance with an embodiment of the invention. Referring to FIG. 2A, there is shown the leaky wave antenna 202 which may be similar to or the same as the antennas 104 and 108 described with respect to FIG. 1. The antenna 202 comprises a partially reflective surface 201A, a reflective surface 201B, and a feed point 203. The space between the partially reflective surface 201A and the reflective surface 201B may be filled with dielectric material, for example, and the height, h, between the partially reflective surface 201A and the reflective surface 201B may be utilized to configure the frequency of optimal transmission and reception of the leaky wave antenna 102. In another embodiment of the invention, an air gap may be integrated in the space between the partially reflective surface 201A and the reflective surface 201B to enable MEMS actuation. There is also shown MEMS bias voltage, $+V_{MEMS}$ and $-V_{MEMS}$.

The feed point 203 may comprise a terminal for applying an input voltage to the leaky wave antenna 202 and/or coupling received signals from the antenna 202 to other circuitry. The invention is not limited to a single feed point 203, as is described with respect to FIGS. 6 and 8C.

In an embodiment of the invention, the height, h, may be one-half the wavelength of the desired transmitted mode from the leaky wave antenna 202. In this manner, the phase of an electromagnetic mode that traverses the cavity twice may be coherent with the input signal at the feed point 203, thereby configuring a resonant cavity known as a Fabry-Perot cavity. The magnitude of the resonant mode may decay exponentially in the lateral direction from the feed point 203, thereby reducing or eliminating the need for confinement structures to the sides of the leaky wave antenna 202. The input impedance of the leaky wave antenna 202 may be configured by the vertical placement of the feed point 203, as described further in FIGS. 6 and 8C.

In operation, a received signal may pass through the surface 201A and be reflected back and forth between the surface 201A and 201B. Since the cavity height is half of the wavelength of the signal to be received, waves incident on the feed point will have traveled an integer multiple of a full wavelength, and thus constructive interference may result and a resonant mode may thereby be established. The resonant mode may enable the leaky wave antenna 202 to provide relatively high gain without the need for a large array of antennas or a complex feed network. In various embodiments of the invention, the cavity height of the leaky wave antenna 202 may be configured by MEMS actuation. For example, the bias voltages $+V_{MEMS}$ and $-V_{MEMS}$ may deflect one or both of the reflective surfaces 201A and 201B compared to zero bias, thereby configuring the height of the cavity and thus the resonant frequency of the cavity.

Figure 3:
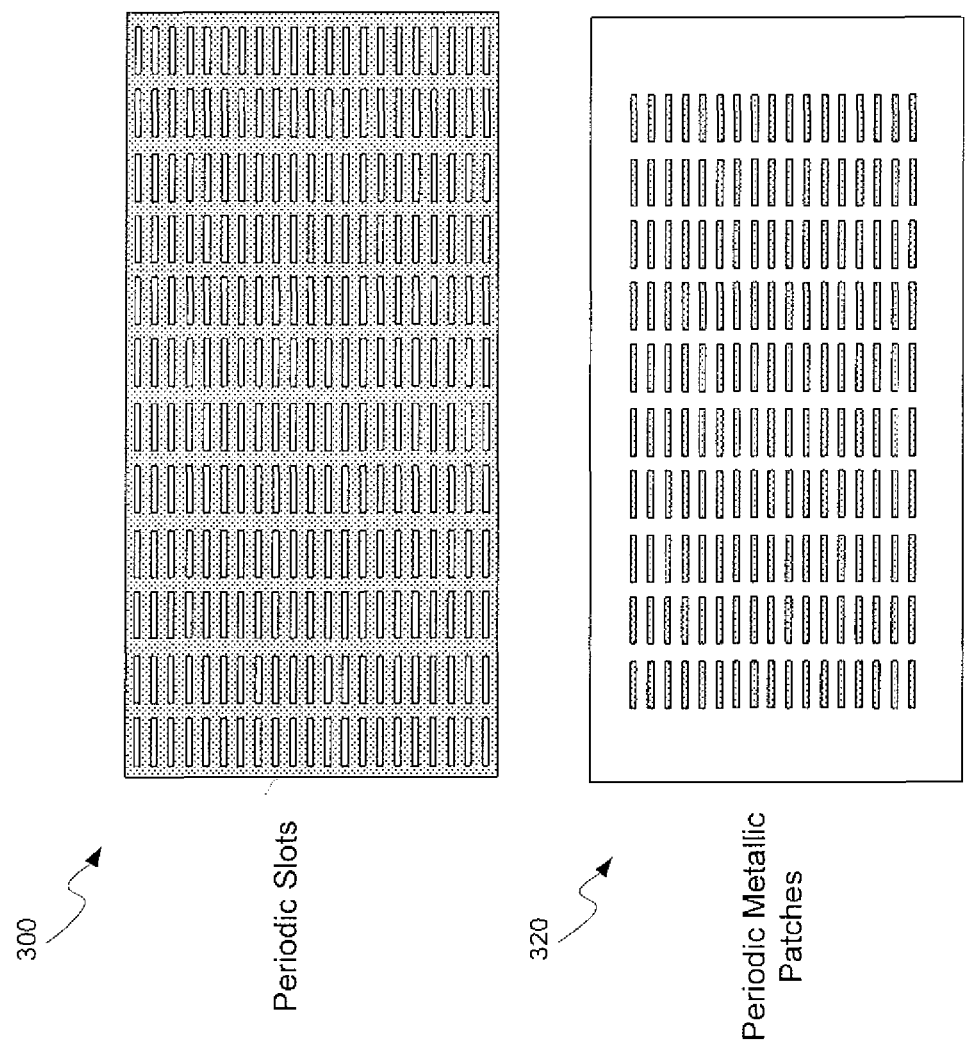
FIG. 3 is a block diagram illustrating a plan view of exemplary partially reflective surfaces for a leaky wave antenna, in accordance with an embodiment of the invention.

FIG. 3 is a block diagram illustrating a plan view of exemplary partially reflective surfaces for a leaky wave antenna, in accordance with an embodiment of the invention. Referring to FIG. 3, there is shown a partially reflective surface 300 comprising periodic slots in a metal surface, and a partially reflective surface 320 comprising periodic metal patches. The partially reflective surfaces 300/320 may comprise different embodiments of the partially reflective surface 201A described with respect to FIG. 2.

The spacing, dimensions, shape, and orientation of the slots and/or patches in the partially reflective surfaces 300/320 may be utilized to configure the bandwidth, and thus Q-factor, of the resonant cavity defined by the partially reflective surfaces 300/320 and a reflective surface, such as the reflective surface 201B, described with respect to FIG. 2. The partially reflective surfaces 300/320 may thus comprise frequency selective surfaces due to the narrow bandwidth of signals that may leak out of the structure as configured by the slots and/or patches.

The spacing between the patches and/or slots may be related to wavelength of the signal transmitted and/or received, which may be somewhat similar to beamforming with multiple antennas. The length of the slots and/or patches may be several times larger than the wavelength of the transmitted and/or received signal or less, for example, since the leakage from the slots and/or regions surround the patches may add up, similar to beamforming with multiple antennas. In an embodiment of the invention, the slots/patches may be configured via CMOS and/or micro-electromechanical system (MEMS) to tune the Q of the resonant cavity.

Figure 4:
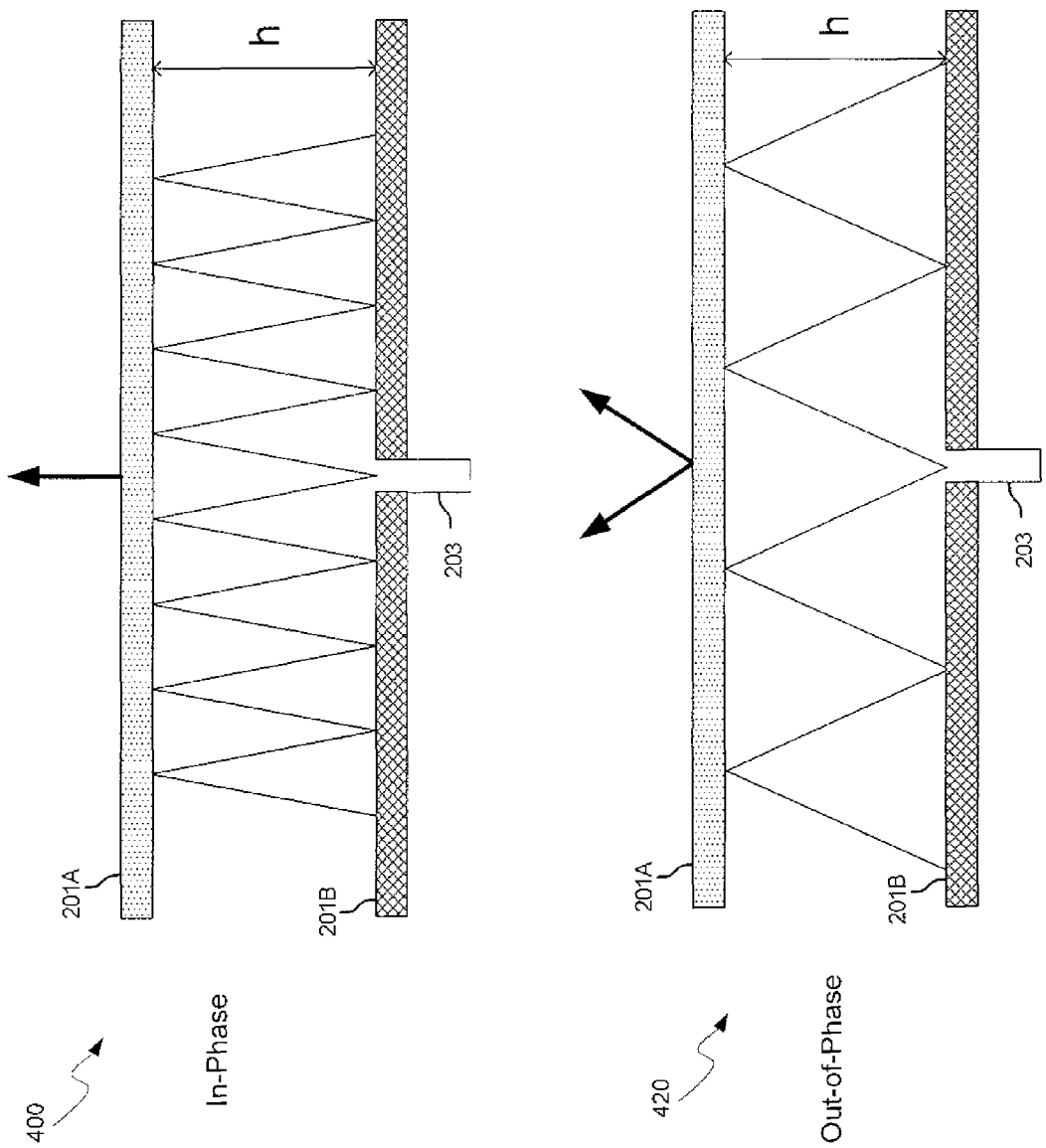
FIG. 4 is a block diagram illustrating an exemplary phase dependence of a leaky wave antenna, in accordance with an embodiment of the invention.

FIG. 4 is a block diagram illustrating an exemplary phase dependence of a leaky wave antenna, in accordance with an embodiment of the invention. Referring to FIG. 4, there is shown a leaky wave antenna 104 or 108 comprising the partially reflective surface 201A, the reflective surface 201B, and the feed point 203. In-phase condition 400 illustrates the relative beam shape transmitted by the leaky wave antenna when the frequency of the signal communicated to the feed point 203 matches that of the resonant cavity as defined by the cavity height, h, and the dielectric constant of the material between the reflective surfaces. Similarly, out-of-phase condition 420 illustrates the relative beam shape transmitted by the leaky wave antenna when the frequency of the signal communicated to the feed point 203 does not match that of the resonant cavity. The resulting beam shape may be conical, as opposed to a single main vertical node. These are illustrated further with respect to FIG. 5.

By configuring the leaky wave antenna 104 or 108 for in-phase and out-of-phase conditions, signals possessing different characteristics may be directed in desired directions. In an exemplary embodiment of the invention, the angle at which signals may be transmitted or received by a leaky wave antenna 104 or 108 may be dynamically controlled so that signal may be directed to desired receiving leaky wave antennas. In another embodiment of the invention, the leaky wave antenna 104 or 108 may be operable to receive RF signals, such as 60 GHz signals, for example. The direction in which the signals are received may be configured by the in-phase and out-of-phase conditions.

Figure 5:
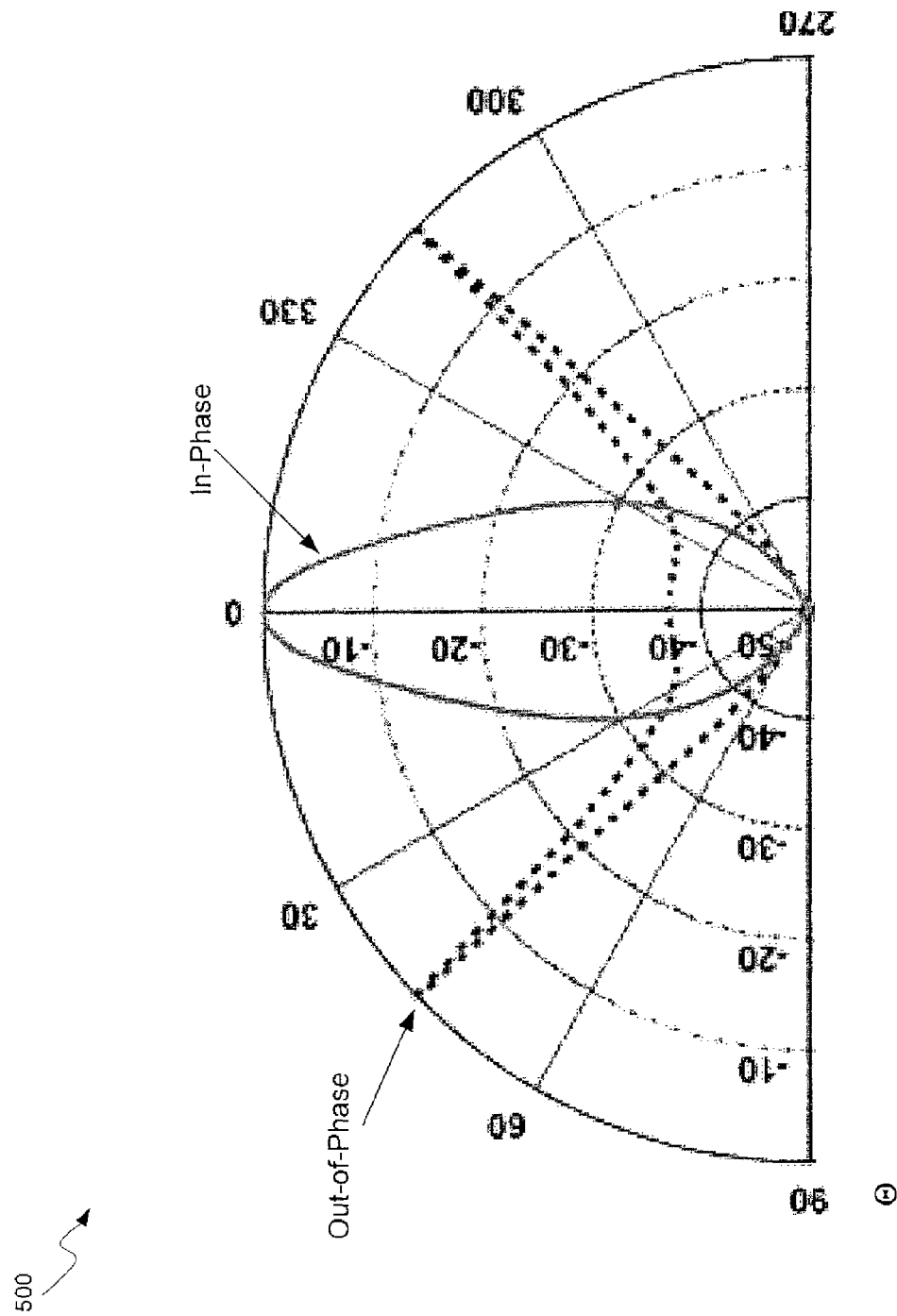
FIG. 5 is a block diagram illustrating exemplary in-phase and out-of-phase beam shapes for a leaky wave antenna, in accordance with an embodiment of the invention.

FIG. 5 is a block diagram illustrating exemplary in-phase and out-of-phase beam shapes for a leaky wave antenna, in accordance with an embodiment of the invention. Referring to FIG. 5, there is shown a plot 500 of transmitted signal beam shape versus angle, □ for the in-phase and out-of-phase conditions for a leaky wave antenna 104 or 108.

The In-phase curve in the plot 500 may correlate to the case where the frequency of the signal communicated to a leaky wave antenna 104 or 108 matches the resonant frequency of the cavity. In this manner, a single vertical main node may result. In instances where the frequency of the signal at the feed point is not at the resonant frequency, a double, or conical-shaped node may be generated as shown by the Out-of-phase curve in the plot 500. By configuring the leaky wave antennas for in-phase and out-of-phase conditions, the leaky wave antenna 104 or 108 may be configured to receive signals from a desired direction via the in-phase and out-of-phase configurations.

Figure 6:
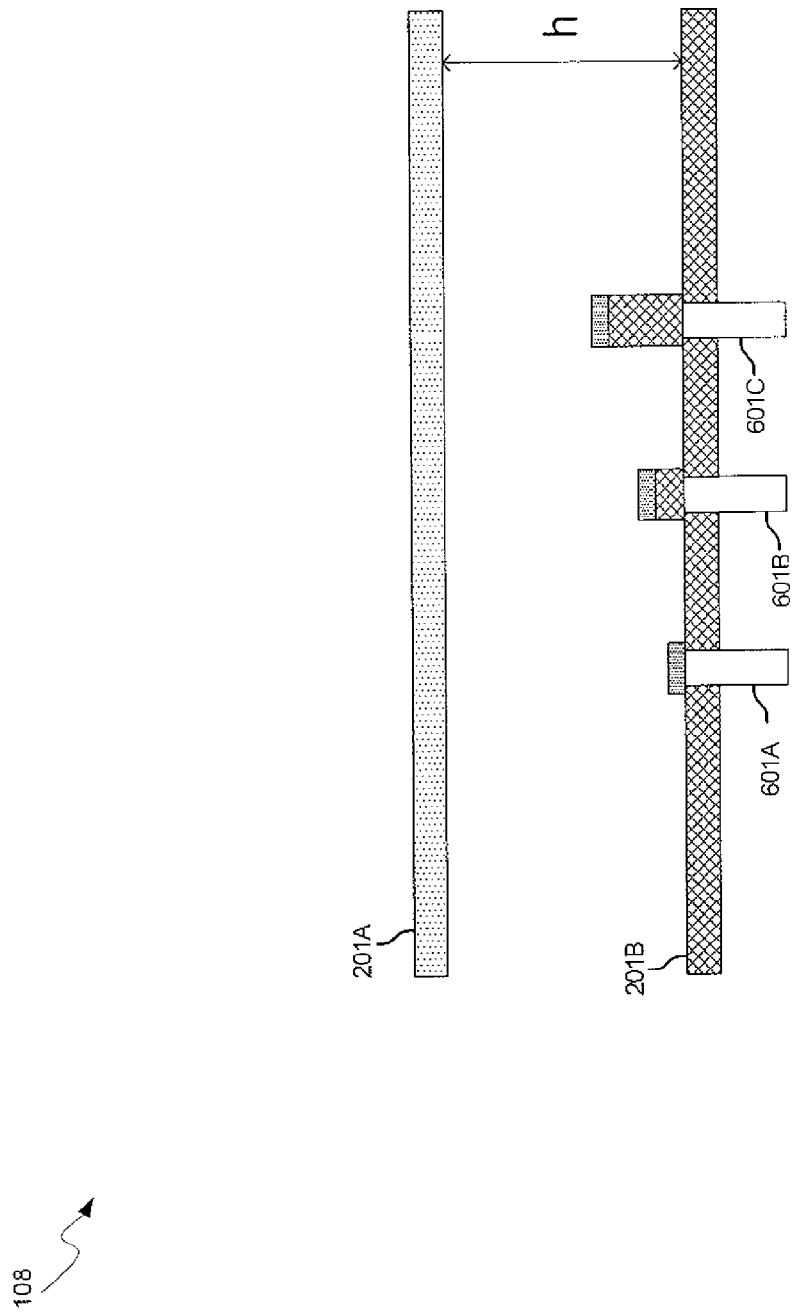
FIG. 6 is a block diagram illustrating a leaky wave antenna with variable input impedance feed points, in accordance with an embodiment of the invention.

FIG. 6 is a block diagram illustrating a leaky wave antenna with variable input impedance feed points, in accordance with an embodiment of the invention. Referring to FIG. 6, there is shown a leaky wave antenna 600 comprising the partially reflective surface 201A and the reflective surface 201B. There is also shown feed points 601A-601C. The feed points 601A-601C may be located at different positions along the height of the cavity thereby configuring different impedance points for the leaky wave antenna 600. Accordingly, as described below with respect to FIG. 8C, a satellite device 102 may select, via one or more switches and/or microelectromechanical systems (MEMS), between the various feed points 601A, 601B, and 601C to control an input impedance. In this manner, the amplitude of a backscattered signal 107 may be modulated by switching between two or more feed points of a leaky wave antenna.

Figure 7:
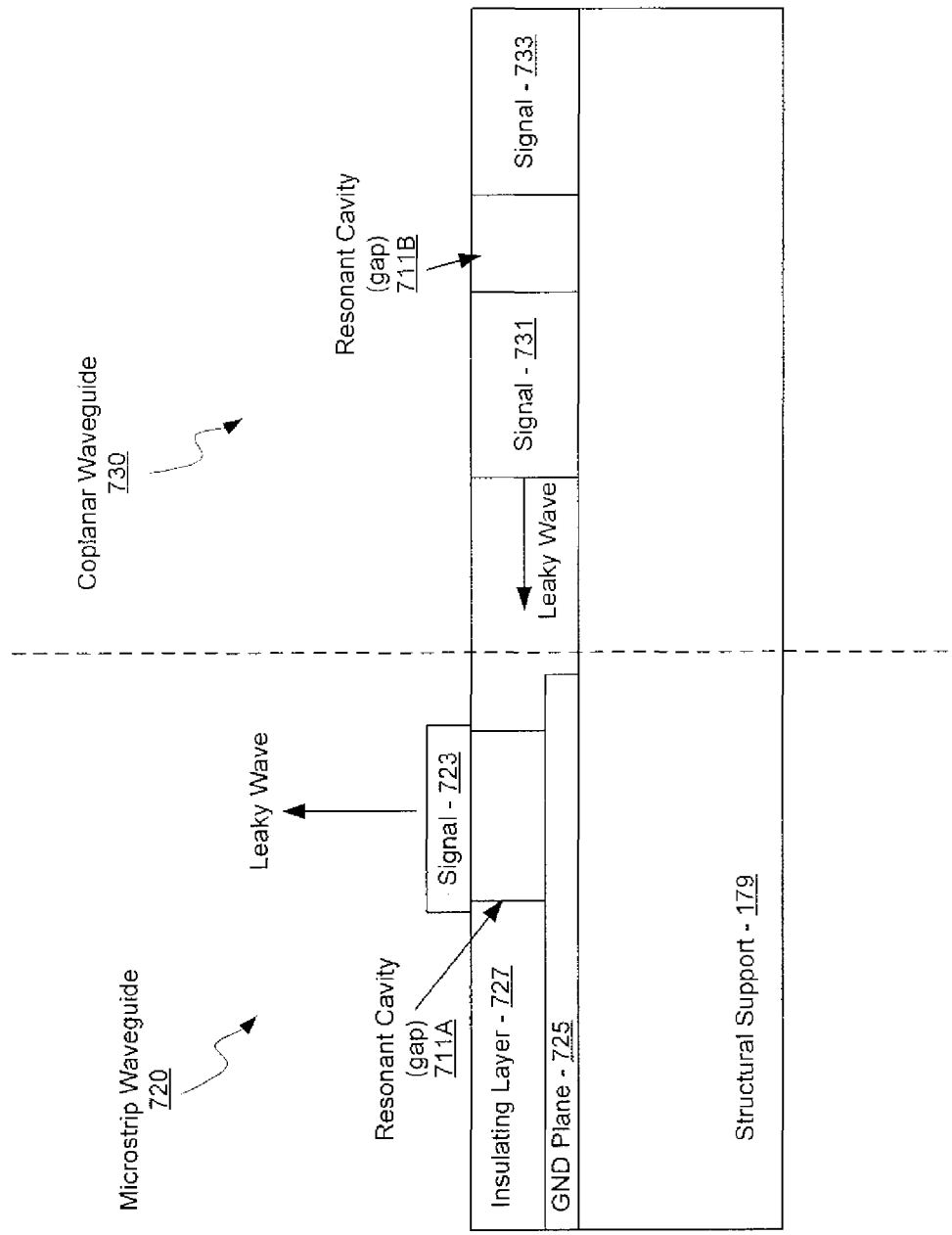
FIG. 7 is a block diagram illustrating a cross-sectional view of coplanar and microstrip waveguides, in accordance with an embodiment of the invention.

FIG. 7 is a block diagram illustrating a cross-sectional view of coplanar and microstrip waveguides, in accordance with an embodiment of the invention. Referring to FIG. 7, there is shown a microstrip waveguide 720 and a coplanar waveguide 730. The microstrip waveguide 720 may comprise signal conductive lines 723, a ground plane 725, a gap 711A, an insulating layer 727 and a support structure 729 which may be a semiconductor substrate, a ceramic IC package, plastic, and/or a dielectric material. The coplanar waveguide 730 may comprise signal conductive lines 731 and 733, a gap 711B, the insulating layer 727, and the support structure 729.

The signal conductive lines 723, 731, and 733 may comprise metal traces or layers deposited in and/or on the insulating layer 727. In another embodiment of the invention, the signal conductive lines 723, 731, and 733 may comprise poly-silicon or other conductive material. The separation and the voltage potential between the signal conductive line 723 and the ground plane 725 may determine the electric field generated therein. In addition, the dielectric constant of the insulating layer 727 may also determine the electric field between the signal conductive line 723 and the ground plane 725.

The insulating layer 727 may comprise $SiO_2$ or other insulating material that may provide a high resistance layer between the signal conductive line 723 and the ground plane 725, and the signal conductive lines 731 and 733. In addition, the electric field between the signal conductive line 723 and the ground plane 725 may be dependent on the dielectric constant of the insulating layer 727.

The thickness and the dielectric constant of the insulating layer 727 may determine the electric field strength generated by the applied signal. The resonant cavity thickness of a leaky wave antenna may be dependent on the spacing between the signal conductive line 723 and the ground plane 725, or the distance between signal conductive lines 731 and 733, for example. In an exemplary embodiment of the invention, the insulating layer 727 may be removed in localized regions in the microstrip waveguide 720 and the coplanar waveguide 730 to configure the gaps 711A and 711B, thereby allowing for MEMS deflection of the conductive layers and configuring of the height of the resonant cavity.

The signal conductive lines 731 and 733, and the signal conductive line 723 and the ground plane 725 may define resonant cavities 711A and 711B, respectively, for leaky wave antennas. Each layer may comprise a reflective surface or a partially reflective surface depending on the pattern of conductive material. For example, a partially reflective surface may be configured by alternating conductive and insulating material in a 1-dimensional or 2-dimensional pattern. In this manner, signals may be directed out of, or received into, a surface of the transponder 100, as illustrated with the microstrip waveguide 720.

The structural support 179 may provide mechanical support for the microstrip waveguide 720, the coplanar waveguide 730, and other devices that may be integrated within. In various embodiment of the invention, the structural support 179 may comprise Si, GaAs, sapphire, InP, GaO, ZnO, CdTe, CdZnTe, ceramics, polytetrafluoroethylene, and/or $Al_2O_3$, for example, or any other substrate material.

In operation, a bias and/or a signal voltage may be applied across the signal conductive line 723 and the ground plane 725, and/or the signal conductive lines 731 and 733. The thickness of a leaky wave antenna resonant cavity may be dependent on the distance between the conductive lines in the microstrip waveguide 720 and/or the coplanar transmission waveguide 730.

By alternating patches of conductive material with insulating material, or slots of conductive material in dielectric material, a partially reflective surface may result, which may allow a signal to "leak out" in that direction, as shown by the Leaky Wave arrows in FIG. 7. In this manner, wireless signals may be directed out of the surface plane of the chip 162, or parallel to the surface of the structural support 179.

Figure 8:
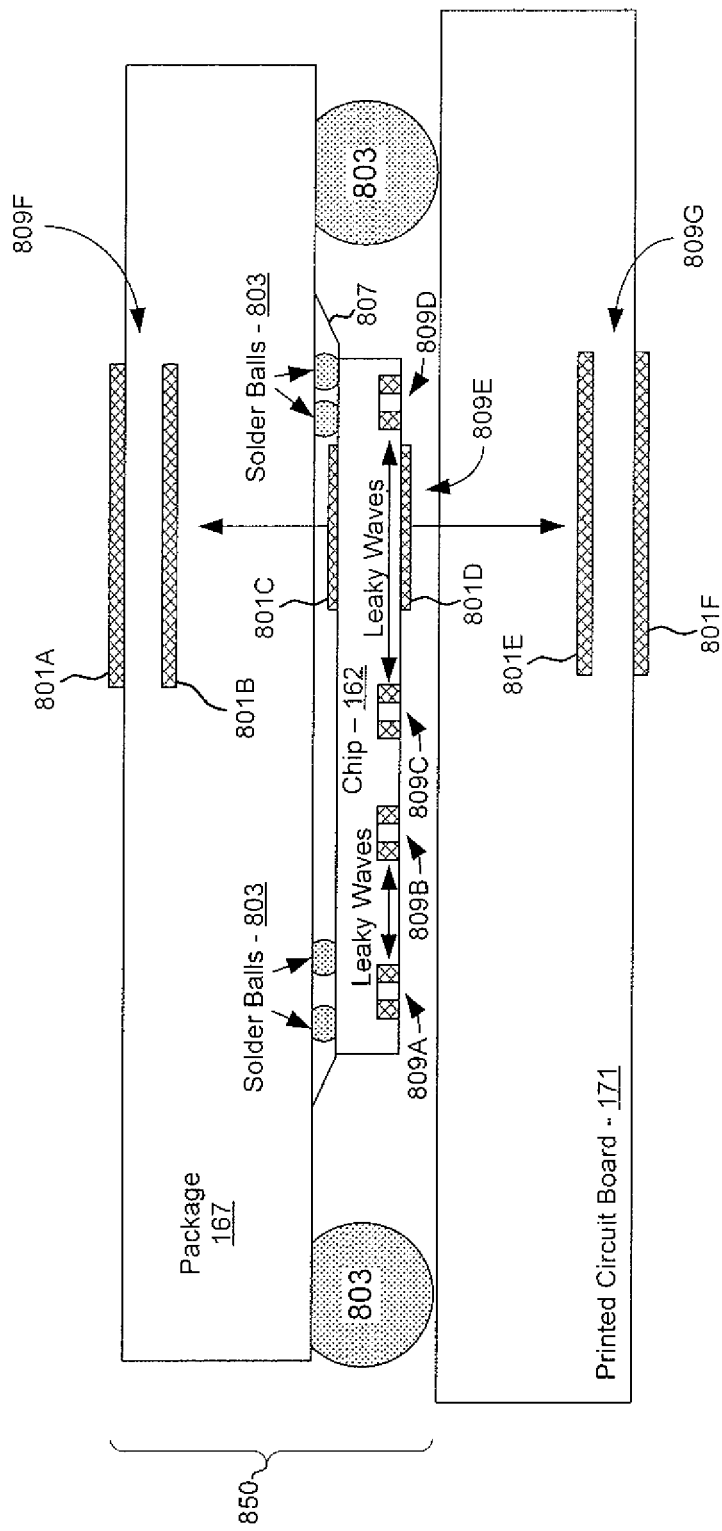
FIG. 8 is a diagram illustrating a cross-sectional view of a packaged integrated circuit with integrated leaky wave antennas, in accordance with an embodiment of the invention.

FIG. 8 is a diagram illustrating a cross-sectional view of a packaged integrated circuit with integrated leaky wave antennas, in accordance with an embodiment of the invention. Referring to FIG. 8, there is shown a packaged integrated circuit 850 mounted on PCB 171. The packaged integrated circuit comprises metal layers 801A-801D, solder balls 803, an insulating layer 805, thermal epoxy 807, and leaky wave antennas 809A-809F. Also shown are metal layers 801E and 801F and the leaky wave antenna 102C on and/or within the PCB 171. Any of the leaky wave antennas 809A-809G may correspond to one of the leaky wave antennas 104 and 108 described with respect to FIG. 1.

The integrated circuit ("chip") 162 may comprise circuitry manufactured on a substrate which may be a semiconductor material. In an exemplary embodiment of the invention, the IC 162 may comprise a system-on-chip such as may be found in the central device 102 and/or the satellite devices 106a-106d.

The package 167 may comprise, for example, a ceramic package. The package 167 may comprise insulating and conductive material, for example, and may provide isolation between electrical components mounted on the package 167. The chip 162 may, for example, be bump-bonded or flip-chip bonded to the package 167 utilizing the solder balls 803. In this manner, wire bonds connecting the chip 162 to the package 167 may be eliminated, thereby reducing and/or eliminating uncontrollable stray inductances due to wire bonds, for example. In addition, the thermal conductance out of the chip 162 may be greatly improved utilizing the solder balls 803 and the thermal epoxy 807. The thermal epoxy 807 may be electrically insulating but thermally conductive to allow for thermal energy to be conducted out of the chip 162 to the much larger thermal mass of the package 167. The metal layers 801A-801F may comprise deposited metal layers utilized to delineate leaky wave antennas in and/or on the chip 162, the package 167, and the printed circuit board 171.

In an embodiment of the invention, the spacing between pairs of metal layers, for example 801A and 801B, 801C and 801D, and 801E and 801F, may define vertical resonant cavities of leaky wave antennas. In this regard, a partially reflective surface, as shown in FIGS. 2 and 3, for example, may enable the resonant electromagnetic mode in the cavity to leak out from that surface. In this manner, leaky wave antennas may be operable to communicate wireless signals to and/or from the chip 162 to the package 167 and/or the printed circuit board 171, and/or to external devices.

The metal layers 801A-801F may comprise microstrip structures as described with respect to FIG. 7. The region between the metal layers 801A-801F may comprise a resistive material that may provide electrical isolation between the metal layers 801A-801F thereby creating a resonant cavity.

The number of metal layers is not limited to the number of metal layers 801A-801F shown in FIG. 8. Accordingly, there may be any number of layers embedded within and/or on the chip 162, the package 167, and/or the printed circuit board 171, depending on the number of leaky wave antennas, traces, waveguides and other devices fabricated.

The solder balls 803 may comprise spherical balls of metal to provide electrical, thermal and physical contact between the chip 162, the package 167, and/or the printed circuit board 171. In making the contact with the solder balls 803, the chip 162 and/or the package 167 may be pressed with enough force to squash the metal spheres somewhat, and may be performed at an elevated temperature to provide suitable electrical resistance and physical bond strength. The thermal epoxy 807 may fill the volume between the solder balls 803 and may provide a high thermal conductance path for heat transfer out of the chip 162.

Figure 9A:
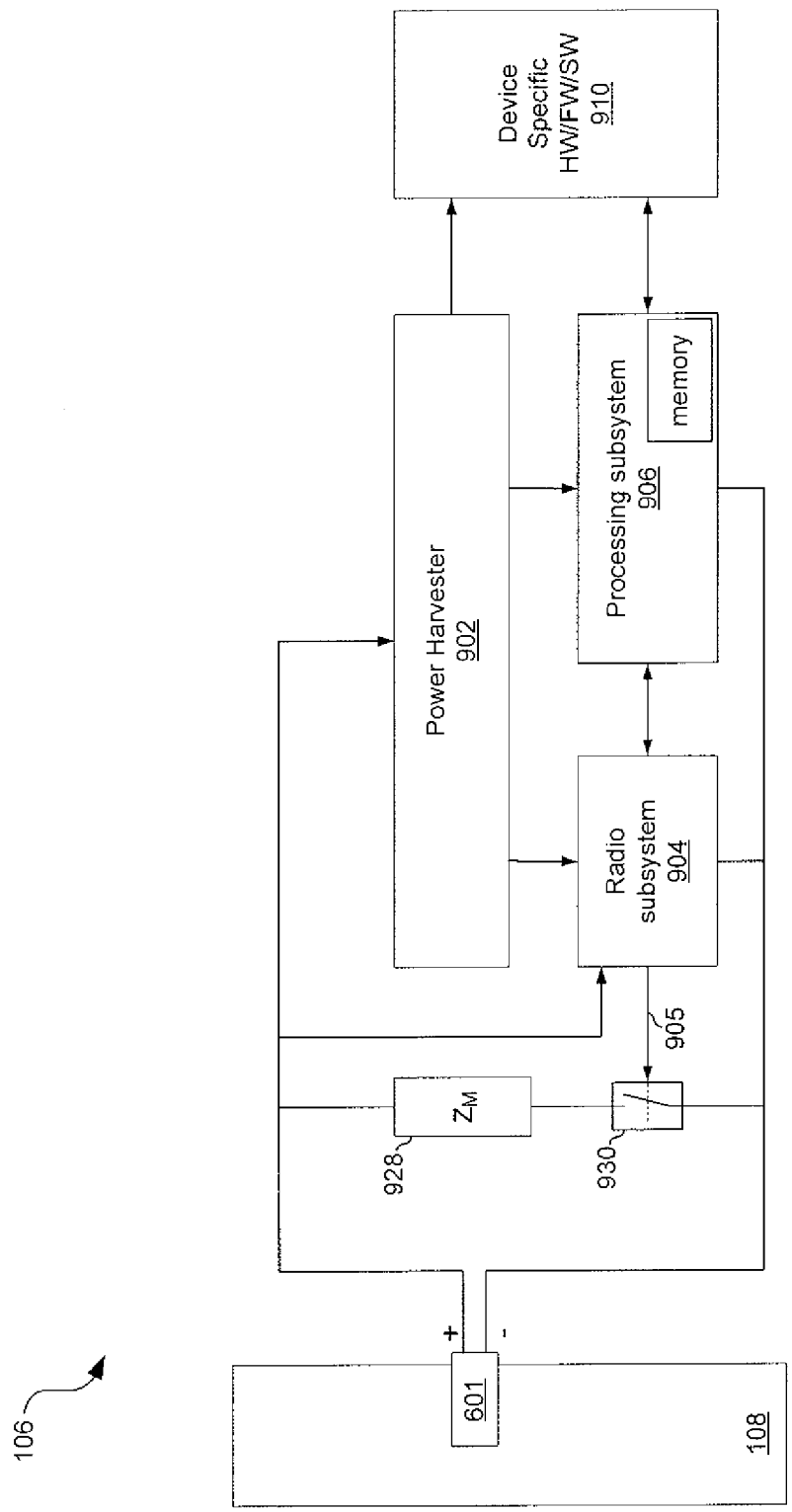
FIG. 9A illustrates an exemplary satellite device which may be wirelessly powered, in accordance with an embodiment of the invention.

FIG. 9A illustrates an exemplary satellite device which may be wirelessly powered, in accordance with an embodiment of the invention. Referring to FIG. 9A, the device 106 comprises the leaky wave antenna 108, a load 928, switch 930, power harvester 902, radio subsystem 904, processing subsystem 906, and device specific module 910.

The load 928 may comprise, for example, one or more resistors, capacitors, inductors, and/or a combination thereof. The switch 930 may comprise, for example, MOSFET switches, or MEMS switches.

The power harvester 902 may comprise suitable logic, circuitry, interfaces, and/or code that may be operable to accumulate charge from a received signal to generate a voltage which may be utilized to power the satellite device 106. In this regard, the high gain of the leaky wave antenna 108 may enable the power harvester 902 to receive sufficient energy to power the satellite device 106. An exemplary power harvester is described below with respect to FIG. 9D.

The radio subsystem 904 may comprise suitable logic, circuitry, interfaces, and/or code that may be operable to receive RF signals and detect information impressed on the received RF signals. In this regard, the radio subsystem 904 may demodulate an RF signal received via the antenna 108 and output the corresponding baseband signal to the processing subsystem 906. Additionally, the radio subsystem 904 may comprise suitable logic, circuitry, interfaces, and/or code to modulate the backscattered signal by controlling the switch 930. The invention is not limited to any particular encoding. As an example, a logic '1' received from the processing subsystem 906 may be communicated by opening and closing switch 904 'X' times over a time interval and a logic '0' may be communicated by opening and closing the switch 930 'Y' times over the same time interval. In this regard, the amplitude of the backscattered signal may change X times over the time interval when a '1' is transmitted and may change Y times when a '0' is transmitted. In various embodiments of the invention, the switch 830 may be switched at or near 900 MHz and/or 2.4 GHz.

The processing subsystem 906 may comprise suitable logic, circuitry, interface(s), and/or code that may be enabled to process baseband signals received from the radio subsystem 904 and generate baseband signals which may be utilized by the radio subsystem 904 to modulate the backscattered signal. For example, processing subsystem 906 may comprise one or more state machines that may generate signals to control the satellite device 106. Control and/or data information utilized for processing received data, for generating data to be transmitted, and/or for controlling operation of the device specific module 910 may be stored in memory in the processing subsystem 906. For example, boot code and/or instructions for powering up the module 910 may be stored in and executed by the processing subsystem 906. Additionally, the processing subsystem 806 may handle data transfers to and from the module 910. In this manner, the module 910 may be controlled based on information received by the radio subsystem 904 and information from the module 910 may be transmitted via the radio subsystem 904.

The device specific module 910 may comprise suitable logic, circuitry, interfaces, and/or code that may be operable to implement functionality of the device. The module 910 may comprise, for example, a sensor, a camera, or a peripheral device of a computer.

In operation, an RF signal may be received from the central device 102 and charge may accumulate on one or more capacitors in the power harvester 902 until a sufficient voltage is built up to power up the satellite device 106. Upon power up, the radio subsystem 928 may initially leave the switch 930 in either the open or closed position, whichever results in more efficient reception of the RF signal, and begin receiving the RF signal 105 from the central device 102. The received RF signal 105 may be demodulated by the radio subsystem 904 and the resulting baseband signal which may comprise, for example, a command or request, may be conveyed to the processing subsystem 906. The processing subsystem 906 may process the received baseband signal and perform an appropriate action in response. For example, the module 910 may comprise a sensor and the baseband signal may be a request for a reading from the sensor. Accordingly, the baseband signal may cause the processing system 906 to power up the module 910, collect a reading, and then communicate the reading to the central device 102 via a backscattered signal generated by modulating the input impedance via the switch 930. For another example, the module 910 may comprise a memory and the baseband signal may comprise a write command and corresponding data to be written to the memory. Accordingly, the baseband signal may cause the processing system 906 to power up the module 910, store the data to memory, and then send a backscattered signal 107 to the central device 102 to indicate that the write was successful.

Figure 9B:
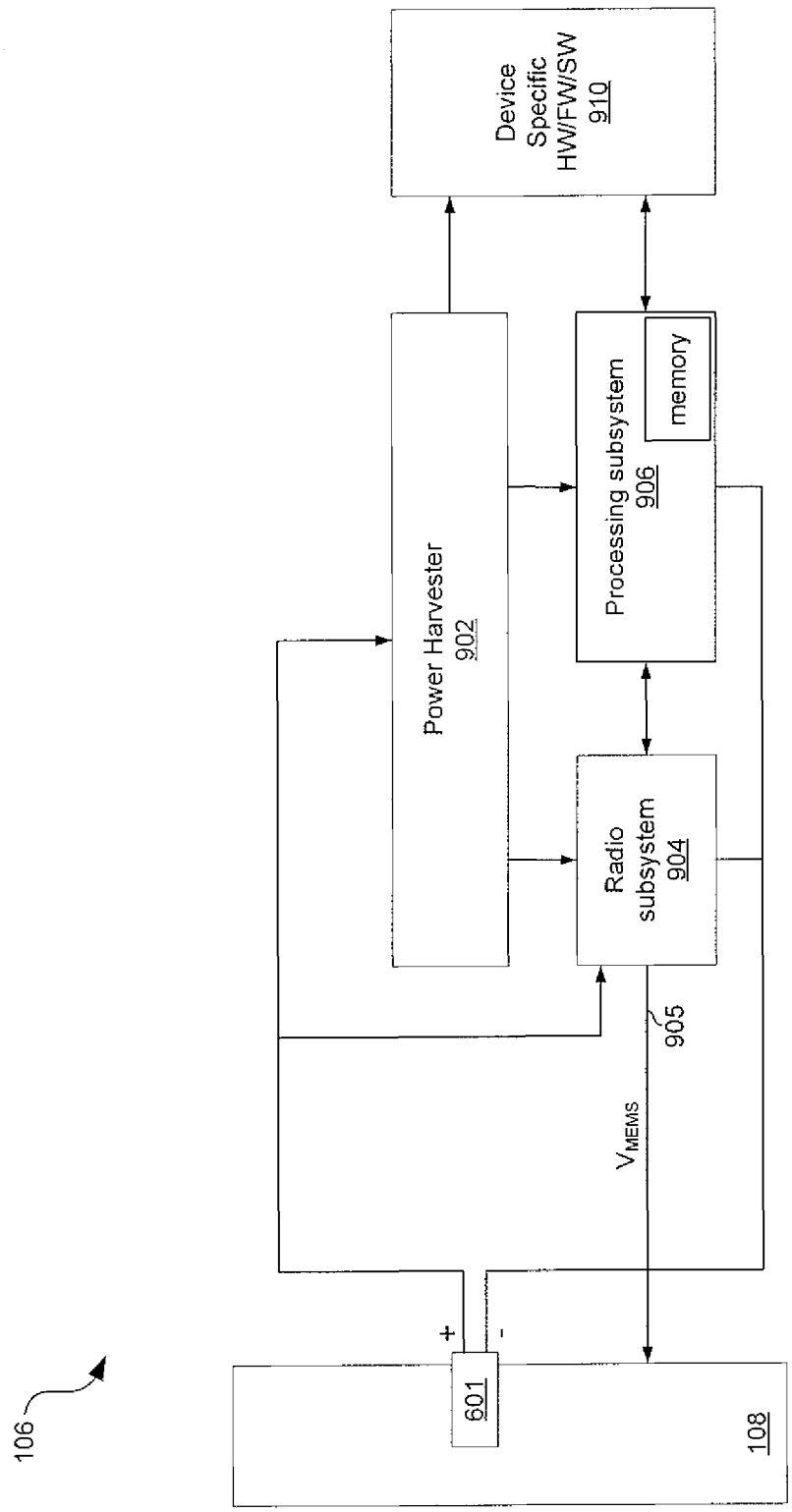
FIG. 9B illustrates an exemplary satellite device which may be wirelessly powered, in accordance with an embodiment of the invention.

FIG. 9B illustrates an exemplary satellite device which may be wirelessly powered, in accordance with an embodiment of the invention. Referring to FIG. 9B, the satellite device 106 may be substantially the same as described with respect to FIG. 9A. However, rather than switching between a loaded antenna and open-circuited antenna as in FIG. 9A, the radio subsystem 128 in FIG. 9B may control a MEMS that may determine the height of the resonant cavity of the leaky wave antenna 108. For example, when the signal 905 is a logic '1' the height of the cavity of the leaky wave antenna 108 may be h1 and when signal 905 is a logic '0' the height of the cavity of the leaky wave antenna 108 may be h2. In this regard, since altering the height of the cavity changes the resonant frequency of the backscattered signal, switching between the two heights may frequency modulate the response bit sequence onto the backscattered signal.

Figure 9C:
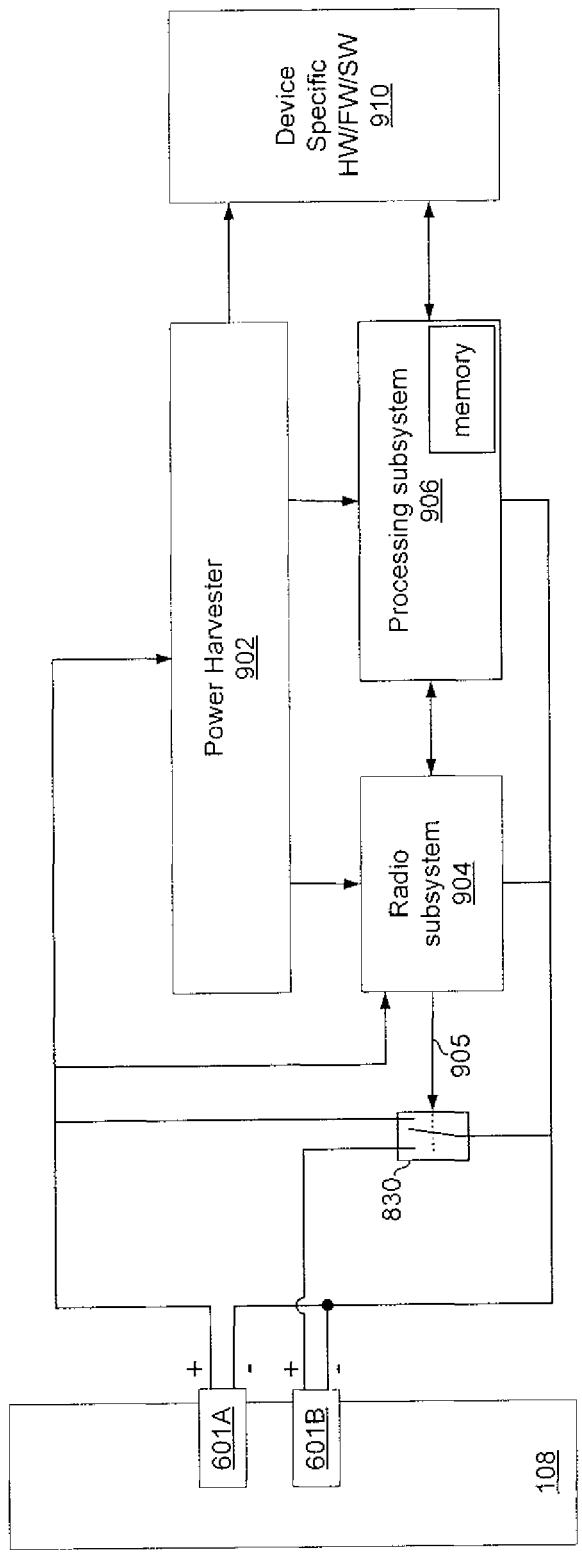
FIG. 9C illustrates an exemplary satellite device which may be wirelessly powered, in accordance with an embodiment of the invention.

FIG. 9C illustrates an exemplary satellite device which may be wirelessly powered, in accordance with an embodiment of the invention. Referring to FIG. 9C, the satellite device 106 may be substantially the same as described with respect to FIG. 9A. However, rather than switching between a loaded antenna and open-circuited antenna as in FIG. 9A, the satellite device 106 in FIG. 9C may select between two feed points 601A and 601B. The feed points 601A and 601B may present different impedances as described below with respect to FIG. 6. For example, when the signal 905 is a logic '1' the feed point 601A may be selected and when signal 905 is a logic '0' the feed point 601B may be selected. In this regard, because altering the input impedance of the antenna alters the amplitude of the backscattered signal, switching between the terminals 120A and 120C may amplitude modulate the response bit sequence onto the backscattered signal.

Figure 9D:
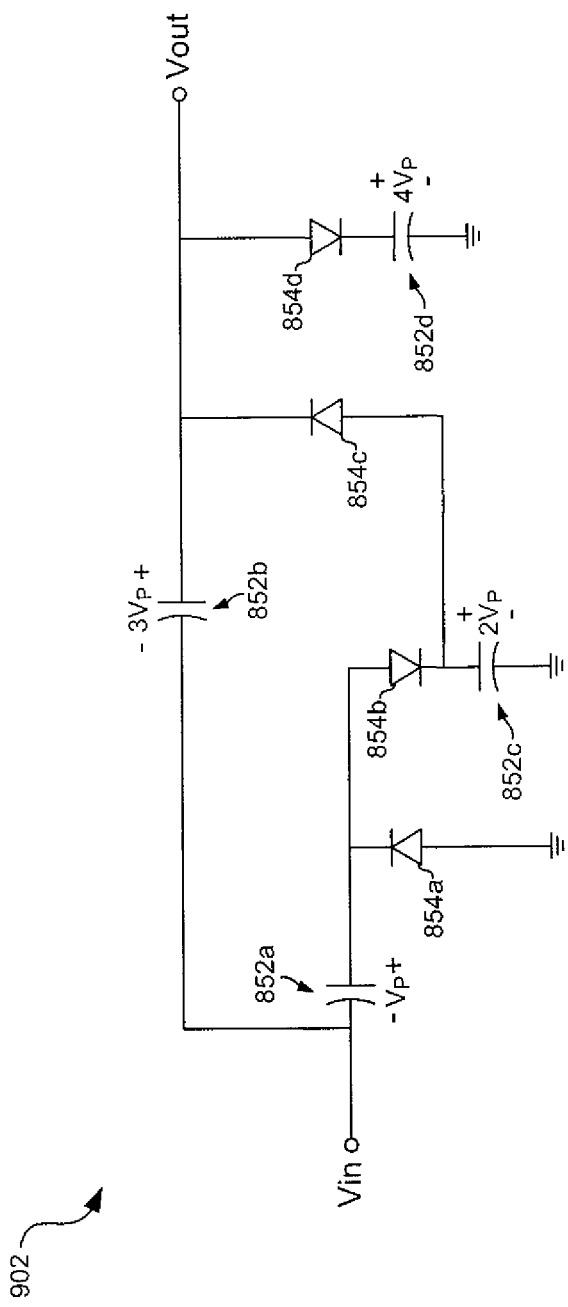
FIG. 9D depicts an exemplary power harvester, in accordance with an embodiment of the invention.

FIG. 9D depicts an exemplary power harvester, in accordance with an embodiment of the invention. Referring to FIG. 9D there is shown capacitors 852a-852d and diodes 854a-854d. In operation a RF signal having a peak voltage of Vp may be incident on the terminal Vin and may result in a voltage of 4*Vp across the capacitor 852d.

Figure 10:
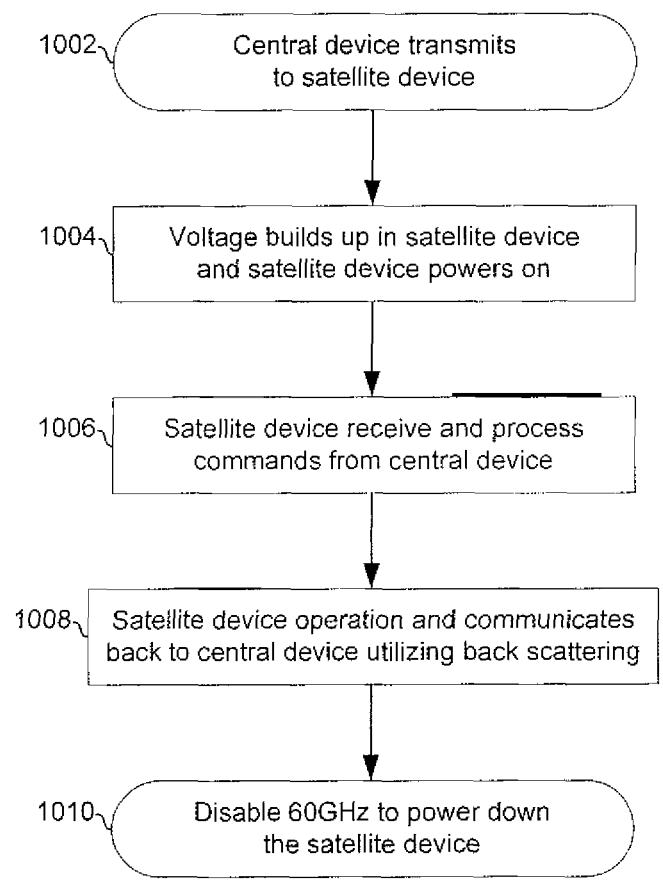
FIG. 10 is a flow chart illustrating exemplary steps for remote power distribution and networking for passive devices, in accordance with an embodiment of the invention.

FIG. 10 is a flow chart illustrating exemplary steps for remote power distribution and networking for passive devices, in accordance with an embodiment of the invention. Referring to FIG. 10, the exemplary steps may begin with step 1002, with the central device 102 transmitting signal 105 to a satellite device 106. In step 1004, energy from the signal 105 may cause charge to accumulate on one or more capacitors in the satellite device 106 until a sufficient voltage is built up to power on the satellite device 106. In step 1006, the satellite device 106 may process a received signal to recover a command from the signal 105. In step 1008, the satellite device 106 may perform one or more functions in response to the command and communicate a result or acknowledgment back to the central device utilizing backscattering. In step 1010, the central device 102 may stop transmitting the signal 105 to the satellite device 106 and the satellite device 106 may consequently power down.

Various aspects of a method and system for remote power distribution and networking for passive devices are provided. In an exemplary embodiment of the invention, a sensor 106 comprising a leaky wave antenna may be powered utilizing energy from a radio frequency signal 105 received via the leaky wave antenna 108. The sensor 106 may be operable to recover a baseband signal from the received radio frequency signal 105 and generate one or more sensor readings in response to the received baseband signal. The sensor 106 may be operable to communicate the sensor reading to a source 102 of the received radio frequency signal 105 via a backscattered signal 107. The backscattered signal 107 may be generated by controlling spacing between surfaces 201A and 201B of the leaky wave antenna 108. The spacing between surfaces 201A and 201B of the leaky wave antenna 108 may be controlled via a micro-electromechanical system (MEMS) switch. The backscattered signal 107 may be generated by switching a load 928 in and out of a receive path of the sensor 106. The backscattered signal 107 may be generated by switching between a plurality of feed points 601A and 601B of the leaky wave antenna 108. The frequency of the radio frequency signal 105 may be at or near 60 GHz. The sensor 106 and the leaky wave antenna 108 may be integrated within and/or on an integrated circuit 162. The leaky wave antenna may be integrated within and/or on an integrated circuit package 167. The backscattered signal 107 may be generated by controlling an input impedance of the sensor 106. The backscattered signal 107 may be modulated at 900 MHz or 2.4 GHz.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for a remote power distribution and networking for passive devices.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

Aspects of the present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A communication system comprising:
a sensor including a leaky wave antenna, said sensor being powered utilizing energy from a radio frequency signal received via said leaky wave antenna, said sensor being configured to:
recover a baseband signal from said radio frequency signal;
generate a sensor reading in response to said baseband signal;
communicate said sensor reading to a source of said radio frequency signal via a backscattered signal generated by the leaky wave antenna in accordance with one or more of a plurality of feed points of the leaky wave antenna, each situated at a different location with respect to a distance between surfaces of the leaky wave antenna.

2. The communication system of 1, wherein said sensor controls a spacing between the surfaces of said leaky wave antenna via a micro-electromechanical system (MEMS) switch.

3. The communication system of 1, wherein said radio frequency signal comprises a frequency that is at or near 60 GHz.

4. The communication system of 1, wherein said sensor and said leaky wave antenna are integrated within an integrated circuit.

5. The communication system of 1, wherein said sensor and said leaky wave antenna are integrated on an integrated circuit.

6. The communication system of 1, wherein said leaky wave antenna is integrated within an integrated circuit package.

7. The communication system of 1, wherein said leaky wave antenna is integrated on an integrated circuit package.

8. The communication system of 1, wherein said sensor is integrated within an integrated circuit.

9. The communication system of 1, wherein said sensor is integrated on an integrated circuit.

10. A method for communication, said method comprising:
in a sensor including a leaky wave antenna, said sensor being powered utilizing energy from a radio frequency signal received via said leaky wave antenna:
recovering a baseband signal from said radio frequency signal;
generating a sensor reading in response to said baseband signal;
communicating said sensor reading to a source of said radio frequency signal via a backscattered signal generated by the leaky wave antenna in accordance with one or more of a plurality of feed points of the leaky wave antenna, each situated at a different location with respect to a distance between surfaces of the leaky wave antenna.

11. The method of claim 10, Wherein said sensor controls a spacing between the surfaces of said leaky wave antenna via a micro-electromechanical system (MEMS) switch.

12. The method of claim 10, wherein said radio frequency signal comprises a frequency that is at or near 60 GHz.

13. The method of claim 10, wherein said sensor and said leaky wave antenna are integrated with an integrated circuit.

14. The method of claim 10, wherein said sensor and said leaky wave antenna are integrated on an integrated circuit.

15. The method of claim 10, wherein said leaky wave antenna is integrated in an integrated circuit package.

16. The method of claim 10, wherein said leaky wave antenna is integrated on an integrated circuit package.

17. The method of claim 10, wherein said sensor is integrated within an integrated circuit.

18. The method of claim 10, wherein said sensor is integrated on an integrated circuit.

* * * * *